(12) United States Patent  (10) Patent No.: US 8,404,516 B2
Bauer et al.  (45) Date of Patent: Mar. 26, 2013

(54) METHOD FOR PRODUCING A MEMS PACKAGE

(75) Inventors: Christian Bauer, Munich (DE); Gregor Feiertag, Munich (DE); Hans Krueger, Munich (DE); Alois Stelzl, Munich (DE)

(73) Assignee: EPCOS AG, Munich (DE)

( * ) Notice: Subject to any disclaimer, the term of this patent is extended or adjusted under 35 U.S.C. 154(b) by 458 days.

(21) Appl. No.: 12/627,707

(22) Filed: Nov. 30, 2009

(65) Prior Publication Data

US 2010/0127377 A1 May 27, 2010

Related U.S. Application Data

(63) Continuation of application No. PCT/EP2008/056787, filed on Jun. 2, 2008.

(30) Foreign Application Priority Data

Jun. 4, 2007 (DE) .......................... 10 2007 025 992

(51) Int. Cl.
*H01L 21/00* (2006.01)

(52) U.S. Cl. ........ 438/108; 438/113; 438/118; 438/127; 257/E21.499

(58) Field of Classification Search .................. 438/117, 438/108, 113, 118, 121, 124; 257/E21.499
See application file for complete search history.

(56) References Cited

U.S. PATENT DOCUMENTS

| | | | |
|---|---|---|---|
| 6,078,229 A | 6/2000 | Funada et al. | |
| 6,313,529 B1 * | 11/2001 | Yoshihara et al. | 257/724 |
| 6,627,118 B2 * | 9/2003 | Kageyama et al. | 252/513 |
| 6,630,725 B1 * | 10/2003 | Kuo et al. | 257/659 |
| 6,982,380 B2 | 1/2006 | Hoffmann et al. | |
| 7,170,155 B2 * | 1/2007 | Heck et al. | 257/684 |
| 7,456,497 B2 | 11/2008 | Higashi | |
| 7,544,540 B2 * | 6/2009 | Bauer et al. | 438/108 |
| 7,673,386 B2 * | 3/2010 | Stelzl et al. | 29/840 |
| 2003/0124829 A1 | 7/2003 | Pace | |
| 2004/0100164 A1 | 5/2004 | Murata et al. | |
| 2006/0017324 A1 | 1/2006 | Pace et al. | |
| 2006/0071324 A1 | 4/2006 | Lu et al. | |
| 2006/0151203 A1 * | 7/2006 | Krueger et al. | 174/260 |
| 2006/0267178 A1 | 11/2006 | Metzger | |
| 2007/0190691 A1 * | 8/2007 | Humpston et al. | 438/113 |
| 2009/0068795 A1 | 3/2009 | Higashi | |

FOREIGN PATENT DOCUMENTS

| | | |
|---|---|---|
| DE | 101 64 494 A1 | 7/2003 |
| DE | 10 2004 005 668 A1 | 8/2005 |
| EP | 0 896 427 A2 | 2/1999 |
| EP | 1 433 742 A2 | 6/2004 |
| EP | 1 734 001 A2 | 12/2006 |
| JP | 2002-280470 A | 9/2002 |
| JP | 2004-012668 A | 1/2004 |

(Continued)

*Primary Examiner* — Michael Trinh
(74) *Attorney, Agent, or Firm* — Slater & Matsil, L.L.P.

(57) ABSTRACT

A carrier substrate has a mounting location with a number of electrical connection pads on a top side and external contacts connected thereto on an underside. A metal frame encloses the connection pads of the mounting location. A MEMS chip has electrical contacts on an underside. The MEMS chip is placed on the mounting location of the carrier substrate in such a way that the MEMS chip is seated with an edge region of its underside on the metal frame. Using a flip-chip process, the electrical contacts of the MEMS chip are connected to the connection pads of the carrier substrate by means of bumps the metal frame is connected to the MEMS chip such that a closed cavity is formed between MEMS chip and carrier substrate.

18 Claims, 4 Drawing Sheets

FOREIGN PATENT DOCUMENTS

| | | |
|---|---|---|
| JP | 2005-212016 A | 8/2005 |
| JP | 2005-251898 A | 9/2005 |
| WO | WO 2005/076470 A1 | 8/2005 |
| WO | WO 2005/102910 A1 | 11/2005 |

* cited by examiner

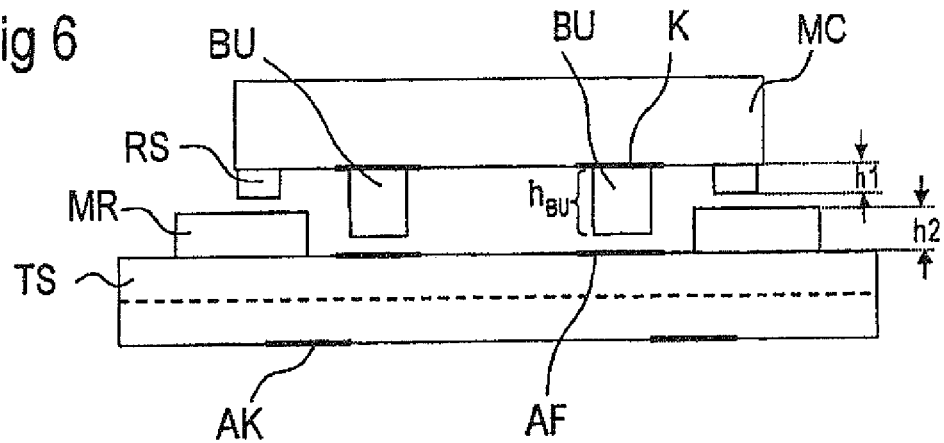
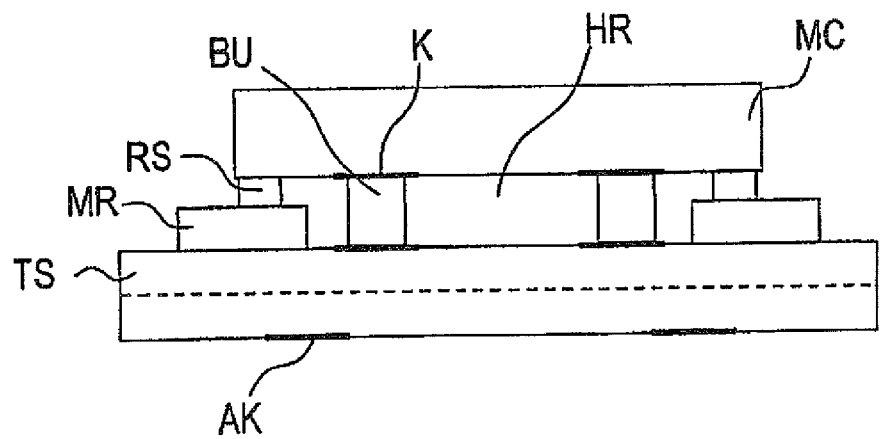
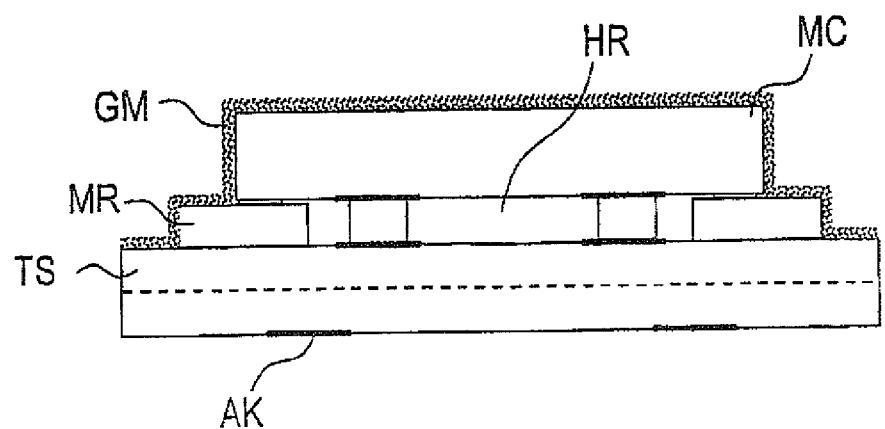

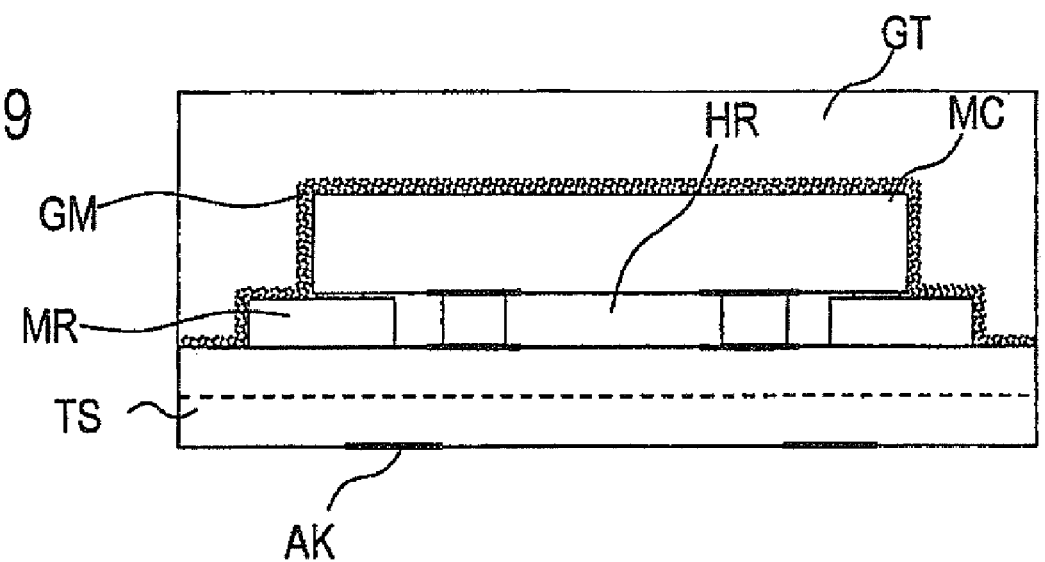

METHOD FOR PRODUCING A MEMS PACKAGE

This application is a continuation of co-pending International Application No. PCT/EP2008/056787, filed Jun. 2, 2008, which designated the United States and was not published in English, and which claims priority to German Application No. 10 2007 025 992.3 filed Jun. 4, 2007, both of which applications are incorporated herein by reference.

TECHNICAL FIELD

The invention relates to a method for producing a package for a MEMS component.

BACKGROUND

Preferred mounting of MEMS chips is effected in a flip-chip arrangement on a substrate comprising electrical connections and, in particular, a wiring. The electrical connection between chip and substrate can comprise bumps which can consist of solder or gold, for example.

Preferably, at the lower edge of the chip facing the substrate, the gap between chip and substrate is closed. Various techniques have already been proposed for this purpose.

Commonly-assigned PCT patent document WO2005/102910 A1 and counterpart U.S. Patent Application Publication 2007/0222056 disclose, for example, a method wherein the chip bears on a support projecting above the substrate and the remaining gap is closed with a polymer or an electrically conductive composition by means of a jet printing method.

A further possibility is to cover the component under a covering film that is laminated thereon.

One disadvantage of the known encapsulation methods is that the mounting of the chip and the encapsulation thereof require a large number of processing steps that make the method complicated and hence costly.

SUMMARY

Aspects of the invention relate to a method for producing a package for a MEMS (microelectromechanical system) component, for example, for a SAW (surface acoustic wave) component, an FBAR (thin film bulk acoustic resonator) component and sensors for pressure, rates of rotation and MEOMS (microelectro-opto-mechanical system). These and similar components have mechanically sensitive component structures at the surface of the MEMS component comprising a chip, which structures have to be encapsulated in the package with a cavity above the chip surface. An electrical connection between electrical contacts on the MEMS chip and a printed circuit board, for example, is necessary alongside or together with the encapsulation.

In one aspect, the present invention specifies a method for producing a MEMS package which leads to a reliable encapsulation of the MEMS component in a simple manner.

A method is proposed which can be carried out in the panel, for example. For this purpose, an in particular large-area carrier substrate is taken as a starting point, the carrier substrate having a multiplicity of mounting locations for MEMS chips. Each mounting location on the carrier substrate has a number of electrical connection pads on the top side corresponding to the number of chip contacts. External contacts on the underside of the carrier substrate are electrically connected to the connection pads. The connection can be purely resistive in nature, inductive, or capacitive, or comprise in parallel a plurality of different possibilities from among those mentioned.

Each mounting location has a metal frame having a planar surface, which metal frame encloses the connection pads. Per location, a MEMS chip having electrical contacts on its underside bearing the MEMS structures is placed onto the carrier substrate in such a way that it is seated with an edge region of its underside on the metal frame.

The placement of the MEMS chips can be effected individually or in the panel or in the chip assemblage. In this case, a relatively large number of MEMS chips can be placed onto the corresponding mounting locations simultaneously. This can be accomplished particularly well if the carrier substrate has a planar surface and particularly little warpage, with the result that a relatively large number of mounting locations are arranged regularly and in a common plane.

In general, provision is made for realizing the electrical and mechanical connection between carrier substrate and MEMS chip in a single flip-chip process, wherein a typical pressure force of 2.5 N-5 N per mm$^2$ chip area is applied to the MEMS chip exposed to ultrasound (US) at typically 60 kHz-100 kHz. The desired connection of the bumps and of the metal frame to the respectively provided connecting areas then arises even at room temperature. An elevated temperature may be advantageous, however.

The US flip-chip process with application of pressure can also be effected in a second step (as it were in the partial panel) if the relative position of MEMS chip and carrier substrate has already been fixed by a preceding first purely thermal or US-assisted flip-chip process. In any event, the two bonding processes can be performed either directly together in a single common step or directly successively in two partial steps of a common connecting process. Between the partial steps, no further measure is necessary or expedient.

In the case of solder connections, a procedure comprising fixing the chip by means of a US flip-chip process with application of pressure is also possible, wherein it is perfectly permissible for a gap to remain between a MEMS chip and metal frame. The carrier substrate (e.g., panel) fully occupied by fixed MEMS chips can then be compressed in a vacuum press or in a vacuum laminating unit in such a way that the MEMS chips are fixedly connected to the metal frame. In this case, the temperatures are chosen such that adhesive bonding connections arise in the case of polymers on the metal frame or soldering connections arise in the case of melting solder.

In this way, a closed cavity enclosed by the metal frame is formed as early as during the connecting process between MEMS chip and carrier substrate.

The method proposed in various embodiments makes it possible to produce both the sealing of the MEMS package and the electrical and mechanical connection between MEMS chip and carrier substrate in a common step or the two directly successive similar partial steps. Additional steps for sealing are no longer necessary.

One simple possibility for connecting the metal frame to the MEMS chip consists in applying, before the placement of the MEMS chip, a connecting region on the metal frame and/or on an edge region on the underside of the MEMS chip. The connecting region produces a fixed connection between metal frame and MEMS chip in the thermal connecting process.

By way of example, a plastic layer is suitable as connecting region, the plastic layer, in the thermal process, producing a welding and/or an adhesive bonding of the two surfaces to be connected. A welding is possible with a thermoplastic material or polymer. An adhesive bonding can also be effected with an uncured or partly cured reaction resin which cures during the thermal process or in a manner initiated thereby and forms an adhesive bonding connection between MEMS chip and metal frame.

A further possibility is to apply a solder layer as connecting region. This is advantageous particularly in combination with a structure which is likewise embodied in frame-type fashion and which is formed in the connecting region, that is to say on an edge region on the underside of the MEMS chip and is dimensioned such that, upon placement on the metal frame, it can be connected to the latter all around. The US-assisted thermal process carried out with application of pressure, if appropriate, then leads to the formation of a solder connection between the frame-type structure and metal frame.

The electrical connection between MEMS chip and carrier substrate, or the electrical contacts and connection pads formed on the corresponding surfaces, is effected by means of bumps, which can be embodied as stud or solder bumps, by way of example. These bumps can be preformed prior to connection on the electrical contacts on the underside of the MEMS chip. In principle, however, it is also possible to form the bumps on the electrical connection pads of the carrier substrate.

Owing to the narrower tolerances to be complied with and the better structurability during the application of the bumps, however, it is preferred for the bumps to be applied on the MEMS chip.

The metal frame on the surface of the carrier substrate has a planar surface. For this purpose, it can be planarized in a separate step before the placement of the MEMS chip such that it is possible for the intrinsically plane MEMS chip to be placed on the metal frame seamlessly and without air gaps. However, it is also possible to planarize the surface of the carrier substrate before the metal frame is produced. During uniform growth of the metal layer or metal layers, a planar surface of the metal frame is also guaranteed in this way. A carrier substrate having a sufficiently smooth surface requires no additional planarization.

It is advantageous to support the connecting process by exerting a pressure, wherein the metallic and/or plastic-comprising surfaces to be connected are pressed onto one another.

It is advantageous if the metal frame has a relatively soft surface coating, for example, a solder layer, and this is combined with a frame-type structure on the MEMS chip, the material of which structure is chosen to be harder than the solder. In this way, by exerting a pressure, it is possible to press the frame-type structure into the relatively soft solder layer and thus to enable a simpler and secure connection of the two surfaces.

In this case, it is advantageous if the frame-type structure has a relatively small cross-sectional or bearing area that is small relative to the bearing area formed by the metal frame.

It is also possible to apply tiny particles and in particular nanoparticles in fine distribution on the surface of the frame-type structure, which consist of metal in particular. The nanoparticles are produced in particular from a material having a higher hardness than the metal frame and the frame-type structure. It is thereby possible, when exerting a pressure after the placement of the MEMS chip onto the metal frame, to press the nanoparticles into the metal frame and/or the frame-type structure and in the process to create a more intimate connection as a result of an enlargement of the surface areas to be connected. What is thus also achieved is that the lateral relative positions of substrate and MEMS chip with respect to one another are maintained and do not change as a result of slipping during the thermal process.

The nanoparticles having a typical size of 0.1-3.0 µm are produced in particular from a ceramic material having high hardness and are advantageously electrically conductive. By way of example, aluminum nitride, boron nitride, carbides and, in particular, electrically conductive SiC are suitable.

A construction for the metal frame comprises, by way of example, an adhesion layer (e.g., composed of Ti or Cr) followed by a layer composed of Cu, Ni, Au, Ag, Pt or Pd. However, above the adhesion layer it is also possible for there to be a layer sequence including at least two of the above-mentioned following layers. The adhesion layer can also be omitted if the substrates, e.g., HTCC or LTCC, are correspondingly pretreated. The following layers can be applied electrolessly (i.e., without an electric current) or alternatively—when a seed layer is present—electrolytically (i.e., with an electric current).

One preferred material for the metal frame is copper, which can be applied and structured in a simple manner in an electrolytic process on the carrier substrate. After a base metallization has been applied, the cutout can be filled with metal in a simple manner by means of electrolytic or electroless methods. Advantageously, at the end of the method before the removal of the resist mask, a planarization process is carried out, in particular a milling method, which provides for a planar surface of the metal frame. This means that even in the case of the carrier substrate having an uneven surface, a planar surface required for the secure and tight connection can still subsequently be produced on the metal frame. In this case, the resist mask protects the rest of the carrier substrate against damage and contamination by the milling method. The resist mask is subsequently removed.

The surface of a copper-containing metal frame can be protected against corrosion and oxidation by a passivation layer in order to maintain the bondability or solderability of the copper layer. For this purpose, layers of noble metals, for example of Au, Pd, Pt and Ag, can be applied in a thin layer on the copper frame. This can be effected in particular directly after the milling, in which case only the metal frame surface serving for forming a connection is then passivated.

The formation of a connection between MEMS chip and carrier substrate requires at least one US-assisted flip-chip process carried out, if appropriate, with application of pressure. If the electrical connection is produced by means of solder bumps, reflow soldering is sufficient and well suited for this purpose. An electrical connection by means of stud bumps can be effected in a thermosonic method that forms a friction welding connection. In principle, however, other methods, too, are suitable which can provide a sufficient thermal budget without an excessively long thermal exposure of MEMS chip and carrier substrate being necessary for this purpose.

With the method just described, the component structures on the underside of the MEMS chip are enclosed into a cavity in which they are protected from damage or functional impairment during further possible encapsulation.

For electromagnetic shielding and also for mechanical stabilization of the assemblage composed of MEMS chip and carrier substrate, it may be advantageous to cover the MEMS chip with a metal layer on the rear side. The metal layer can be applied over the whole area onto the uncovered surfaces of carrier substrate, metal frame, frame-type structure and MEMS chip. A two-part method, in particular, is advantageous for this purpose, wherein, in a first step, a base metallization is applied with thin layer thickness, for example by vapor deposition, sputtering, a CVD method or some other, e.g., plasma-enhanced process. The base metallization subsequently can be reinforced electrolytically or in electroless fashion A good shielding and a sufficient mechanical stabilization are obtained for example with a metal layer having a thickness of from approximately 10 µm. However, even thinner metal layers can be applied.

A two-part method for producing the metallic layer for example includes applying a base layer containing titanium, for example, which subsequently can be reinforced with copper and/or nickel. It is advantageous furthermore for this metallic layer to be contact-connected to an additional electrical connection pad on the surface of the carrier substrate, which can be arranged outside the chip mounting location and, in particular, be connected to a ground connection.

The mechanical stability of the encapsulated MEMS component can additionally be increased by a covering with a sufficiently thick plastic layer. Such a plastic layer can be applied and cured in a dropping or casting method, by way of example. However, it is also possible to envelop the rear side of the MEMS chip with a plastic in a molding or insert molding method. The plastic covering can be doped with conductive particles such that it is also suitable as electromagnetic shielding. However, this or a similar metallic or electrically conductive doping can also serve, after corresponding pretreatment, as a seed layer for a metallization that is applied in electroless fashion and is utilized as shielding. The plastic covering can also be combined with a metallic layer and be encapsulated with the plastic layer by injection molding.

A low-stress encapsulation is made possible by a suitable choice of the materials for metal frame and frame-type structure. In particular, if frame-type structure and metal frame consist of two different materials, it is possible to choose the coefficients of thermal expansion thereof such that the entire connecting structure composed of metal frame and frame-type structure has in the region between MEMS chip and carrier substrate in a direction perpendicular to the chip area the same thermal expansion as the electrical connection by means of the bumps. For a given choice of materials, an appropriate effective total expansion coefficient perpendicular to the chip area can then be obtained by correspondingly setting an appropriate ratio of the heights of metal frame and frame-type structure in total. What is achieved in this way is that electrical connection and encapsulation cannot produce thermal stresses between carrier substrate and MEMS chip even in the event of temperature changes. It is advantageous, moreover, if material of MEMS chip and carrier substrate, in terms of thermal expansion, are adapted to one another and preferably identical.

Given the combination of 42° LT chips (LT42=lithium tantalate with 42° rot. xy cut and a coefficient of thermal expansion CTE in the chip plane of 7 ppm/° K. or 14 ppm/° K.) with LTCC carrier substrates, it may be advantageous to choose an LTCC having a CTE value corresponding approximately to the average value of the two CTE values in the xy plane of LT42, i.e., LTCC having a coefficient of expansion of approximately or equal to 10.5 ppm/° K.

BRIEF DESCRIPTION OF THE DRAWINGS

The invention is explained in more detail below on the basis of exemplary embodiments and the associated figures. The figures serve solely for illustrating the invention and have therefore been drawn up only in purely schematic fashion and not as true to scale, such that neither relative nor absolute dimensional specifications can be inferred from the figures.

FIG. 6 shows an arrangement in cross section in accordance with a fifth exemplary embodiment.

FIG. 7 shows an arrangement after the connection of carrier substrate and MEMS chip.

FIG. 8 shows an arrangement after the connection and the application of a metal layer in schematic cross section.

FIG. 9 shows an arrangement after the additional application of a plastic covering in schematic cross section.

The following list of reference symbols can be used in conjunction with the drawings:
TS Carrier substrate
MC MEMS chip
CA Mounting location
AF Electrical connection pads on carrier substrate
MR Metal frame on TS
RS Frame-type structure on MC
AK External contacts on carrier substrate
VM Connecting region
BU Bump
K Contact on MEMS chip
TL Separating lines
$H_{BU}$ Height of the bumps
$h_1$ Height of the frame-type structure
$h_2$ Height of the metal frame
HR Cavity
GT Plastic covering
GM Metal layer
WS Soft layer

DETAILED DESCRIPTION OF ILLUSTRATIVE EMBODIMENTS

Figure 1:
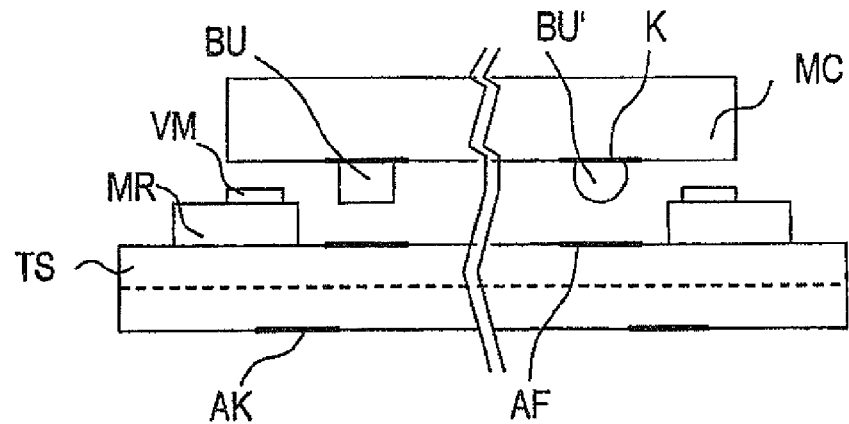
FIG. 1 shows an arrangement of a MEMS chip and carrier substrate shortly before connection in accordance with a first exemplary embodiment in schematic cross section.

FIG. 1 shows an arrangement that includes a carrier substrate TS and a MEMS chip MC in schematic cross section before the connection of the two components. The MEMS chip MC is a component which is present in the form of a chip and which has at its underside electrical contacts K for the electrical component structures (not illustrated in the figure). The component structures are preferably also arranged in the region of the underside of the MEMS chip MC, but also can be provided within the MEMS chip MC. The MEMS chip MC is shown as divided in two in order to illustrate the different electrical contact-connection methods by means of stud bumps BU as in the left-hand part of the illustration or by means of solder bumps BU' as in the right-hand part of the illustration. The bumps BU or BU' are prefabricated on the MEMS chip MC and applied directly over the electrical contacts K. Conventional bump producing methods can be used for this purpose.

One cost-effective method that is easy to carry out for the production of solder bumps BU' is a printing method, for example, by means of a stencil, for example. Stud bumps BU can be applied for example in the form of gold bumps individually by means of a wire bonder. However, it is also possible to produce pillars e.g., composed of Cu and/or Ni and/or gold or composed of Sn, SnAg, etc., in an electrolytic method directly on the underside of the MEMS chip.

While a solder bump having a height h before collapse of about 75 µm typically has, after collapse, a height of about 50 µm, which corresponds to the distance between MEMS chip and carrier substrate. Typical heights for stud bumps are 35 µm before the US flip-chip process, and 20 µm after bonding.

While a solder bump typically has, after collapse, a height of approximately 50 µm, which then also corresponds to the distance between MEMS chip and carrier substrate, typical heights for stud bumps are approximately 20 µm.

The carrier substrate TS is preferably a ceramic substrate, on or in which an interconnection can be realized. Preferably, the carrier substrate is multilayered, in which case it can have at least one wiring plane located internally, which is indicated by a dashed line in the figure. Each of the layers can be 75 µm thick, for example, with the result that a two-layered carrier substrate then has a total thickness of approximately 150 µm. The carrier substrate TS can also be a film, e.g., a Kapton film or a LCP film, which can have a typical thickness of 50 µm in the case of a monolayer construction of the carrier substrate.

On the top side, the carrier substrate TS has electrical connection pads AF connected to the electrical wiring (not illustrated) within the carrier substrate TS. On the underside, the interconnection leads into external contacts AK, by means of which the finished component can be fixed and contact-connected in a circuit environment.

The carrier substrate TS furthermore has a closed metal frame MR on the surface, the metal frame enclosing a mounting location for the MEMS chip MC and, in particular, the electrical connection pads AF on the surface of the carrier substrate which are provided for making contact with the MEMS chip. The metal frame MR is distinguished by a planar surface, for example. Since a multilayered ceramic used for the carrier substrate TS, particularly if it is embodied in large-area fashion, can have an uneven surface on account of warpage during sintering, the metal frame MR is preferably leveled by means of a planarization method in order to obtain a particularly planar surface. The height of the metal frame corresponds to the height of the bumps BU after the connection of carrier substrate and MEMS chip, that is to say approximately 20 µm in the case of stud bumps and approximately 50 µm in the case of solder bumps. An aspect ratio of approximately one or less is set, such that the frame is e.g. 20 µm or respectively 50 µm wide.

At least on parts of the surface of the metal frame MR, a connecting region VM is applied with a smaller layer thickness relative to the frame height. The connecting region is likewise structured in frame-type fashion and arranged at least in the region of the chip edge of the MEMS chip. However, it can also cover the entire metal frame or the surface thereof. The connecting region is therefore shaped in such a way that it can come into contact with the edge region of the MEMS chip upon the placement thereof.

In a first exemplary embodiment, a polymer layer or layer that can be cured to form a polymer is used as connecting region VM. It is preferred to use reaction resins in a precured modification that enables simple application and structuring, the structure of which still has a certain deformability. Thus, the precured reaction resin is sufficiently dimensionally stable, such that it can be applied in structured fashion by being printed on, for example, and yet no undesirable flowing occurs during the thermal application when MEMS chip and carrier substrate are connected. However, it is also possible to apply a thermoplastic polymer in large-area fashion as connecting region VM and then structure it accordingly, e.g., in a photo-process or by direct structuring by means of a laser. A suitable layer thickness for such a connecting region comprising a polymer is 1-10 µm. The polymer layer is structured in such a way that parts of the metal frame MR remain free and can then be metalized in a later step.

In one embodiment, a material suitable for producing a solder connection, in particular a solder, and for example a tin layer, can be applied as connecting region VM. In contrast to the embodiment with a polymer-containing connecting region, for the embodiment with the solder in the edge region of the MEMS chip MC a corresponding metallic surface at the MEMS chip is required, which is suitable for connection to the solder layer. For this purpose, the underside of the MEMS chip MC can have, for example, likewise a frame-type metallization which runs along the chip edge and which is formed like a UBM (under bump metallization) in terms of composition and thickness. The metallization can be single- or multilayered and has a solderable surface, for example a nickel or gold surface. The action of a sufficient thermal budget may be necessary for producing the electrical connection between the electrical contacts on the MEMS chip and the connection pads on the carrier substrate and also the mechanical connection between metal frame and MEMS chip. This is made available preferably by means of a reflow process in the two embodiments that utilize a connecting region. In addition, before or after the reflow process or, if appropriate, simultaneously, by means of a thermosonic method, a soldering-welding connection of the bump BU embodied as a stud bump to the corresponding connection paid AF can be produced. For the embodiment with the solder bumps BU', the reflow method is sufficient to thus simultaneously produce both the bump connection and the connection of the chip edge to the metal frame via the connecting region VM.

Figure 2:
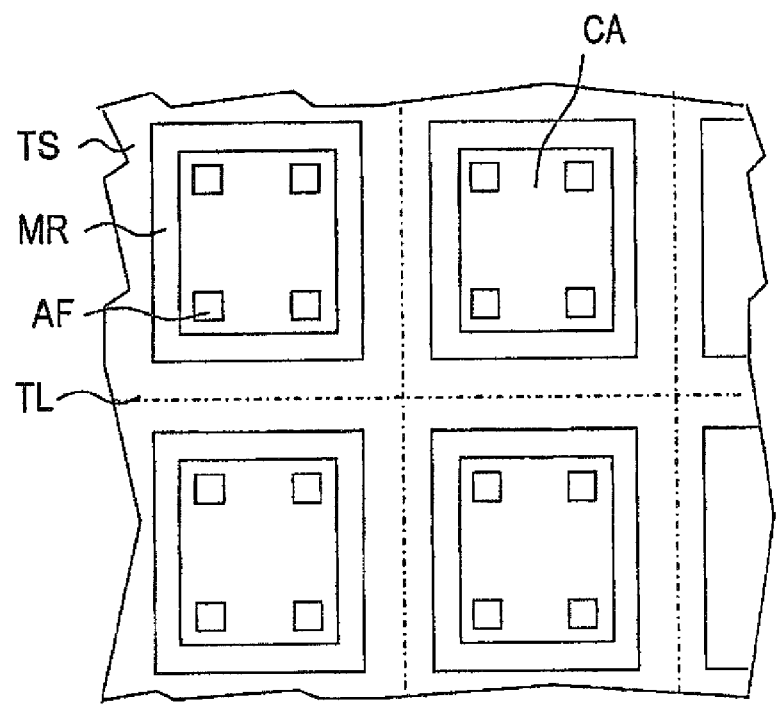
FIG. 2 shows the carrier substrate in schematic plan view.

FIG. 2 shows schematically one possible structuring of the surface of the carrier substrate TS. The latter is preferably embodied in large-area fashion and as a wafer, for example, and has a series of mounting locations CA for MEMS chips. At each mounting location, a series of electrical connection pads in the form of solderable metallization are provided, the number and arrangement of which are dependent on the MEMS chip MC and correspond to the arrangement of the electrical contacts K on the MEMS chip MC. The connection pads AF of each mounting location are surrounded by a metal frame MR, which preferably follows the form of the MEMS chip MC or the outer edge thereof and is embodied here in rectangular fashion, by way of example. In principle, however, it is also possible either for the MEMS chip MC to deviate from the rectangular form or for the metal frame not to continuously follow the chip edge of the MEMS chip and to have rounded "corners", for example. Each chip mounting location CA is separated from the respective adjacent chip mounting location by a virtual separating line TL, along which the finished components can later be singulated. It is also possible to apply different MEMS chips MC on a common carrier substrate TS in the method proposed.

In a further variant of the method illustrated in FIG. 1, it is possible alternatively or additionally to apply the connecting region VM in the edge region on the underside of the MEMS chip MC. A plastic layer which comprises a polymer or can be cured to form a polymer can be applied directly on the edge region of the MEMS chip MC, the surface of which comprises a single crystal, a semiconductor material, an oxide, a metallization or some other material. A connecting region VM comprising solder is applied on a solderable metallization provided in the edge region of the MEMS chip MC.

One exemplary material that can be used as connecting region is BCB (benzocyclobutene), which can be cured thermally to form a polymer. The latter can be applied with a layer thickness of 1 µm-5 µm, for example. In one embodiment, a BCB layer applied on the edge region of the MEMS chip MC can be combined with a further polymer which is applied as connecting region VM on the metal frame and has a thickness of approximately five μm for example.

The metal frame MR preferably comprises a material which is simple to apply and, in particular, can be planarized. Examples of well-suited materials include Cu or Ni or Au, which are sufficiently soft and can be leveled well by means of a milling method. The height of the metal frame MR is preferably adapted to the height of the bumps BU after the production of the bump connection. In this case, of course, the height dimension also includes the height of the layer of the connecting region VM before connection.

The width of the frame MR is such that a sufficient tolerance is complied with when the MEMS chip is placed onto the frame. The outer edge of the frame can be congruent with the outer edge of the MEMS chip MC, but is preferably lengthened beyond the outer edge of the MEMS chip MC and thus encloses a larger base area than the outer edge of the MEMS chip MC. A well-suited typical frame width is approximately 50 μm, for example. However, it is also possible to choose the width of the metal frame MR according to the aspect ratio that is possible as governed by production, although aspect ratios of more than one can have disadvantages owing to a lack of mechanical stability.

Figure 3:
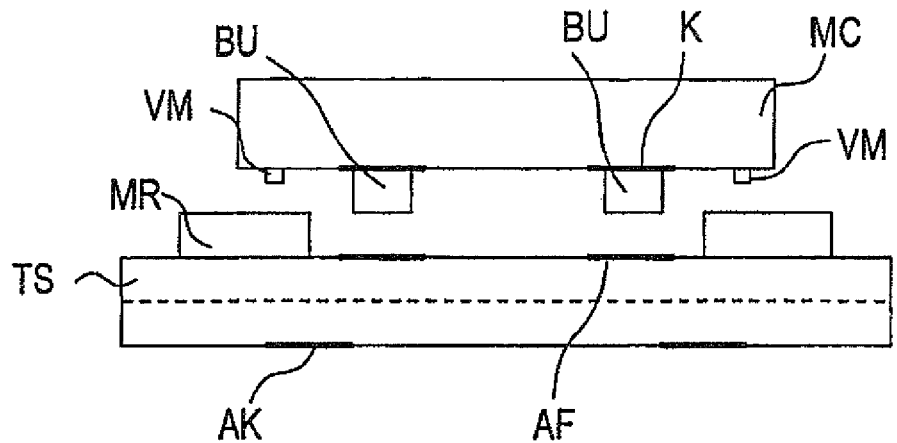
FIG. 3 shows an arrangement in cross section in accordance with a second exemplary embodiment.

FIG. 3 shows, in schematic cross section, a further embodiment as to how a MEMS chip MC can be connected to the carrier substrate TS securely and in a simple manner. In this embodiment, the bumps BU prefabricated on the MEMS chip are now only illustrated as stud bumps, although solder bumps are also suitable, of course, in this embodiment and also in all other embodiments, the solder bumps furthermore being more cost-effective to produce. By comparison with the previous embodiment, the embodiment illustrated in FIG. 3 differs by virtue of the connecting region VM, which is applied in the edge region of the MEMS chip MC and embodied in the form of a metallic frame. This metallic frame has a surface that can be welded to the surface of the metal frame MR, for example in a thermosonic method.

Preferably, the metallic frame on the underside of the MEMS chip is embodied in narrow fashion relative to the width of the metal frame MR and has a cross section of approximately 5×5 μm², for example. This has the advantage that during the thermosonic method used for producing the connection, the mechanical energy introduced by means of ultrasound is concentrated on the small area of the metallic frame-type structure serving here as connecting region VM. It is thus possible to produce a welding with a smaller force and with a larger contact area.

The height of the frame-type structure can be chosen to be as small as desired, although enough material should be present in order to enable the desired friction welding connection to the metal frame MR. Metals that have the corresponding oxide-free surfaces for producing the surface suitable for welding friction connection, in particular copper, nickel, gold, palladium or platinum, are suitable as materials for the metallic frame-type structure serving as connecting region VM. However, it is also possible for the frame-type metallic structure to be embodied in multilayered fashion and for the surface for example exclusively to be embodied as a solderable and weldable surface, for example in the form of a thin gold layer.

The metallic frame-type structure is produced in an electrolytic process, in particular, wherein a resist mask in which the structure of the frame-structure is cut out is used. By means of a previously applied base metallization, with the electrolytic method a metal can be deposited with the desired layer thickness with sufficient layer thickness uniformity. By comparison with the metal frame the planarity of the frame-type structure on the chip underside is predefined by the planar underside of the MEMS chip MC.

Figure 4:
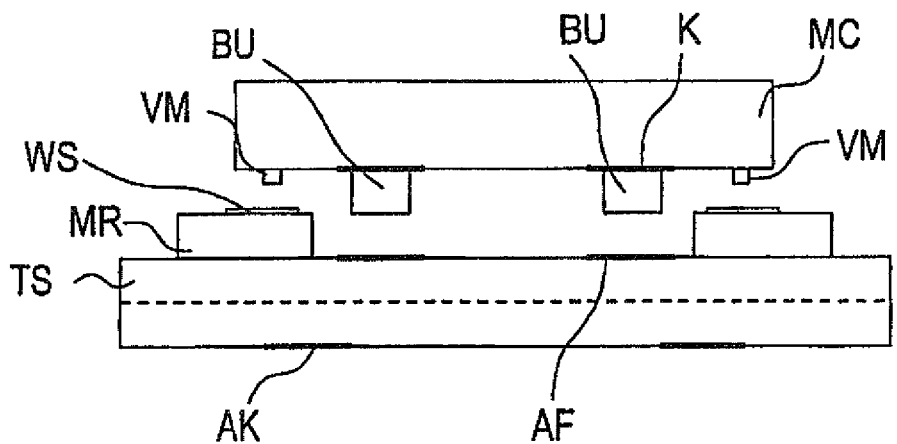
FIG. 4 shows an arrangement in cross section in accordance with a third exemplary embodiment.

FIG. 4 illustrates a further embodiment of the connecting method proposed, wherein here, too, the two parts to be connected are once again illustrated as still separated from one another. In this embodiment, the MEMS chip MC is equipped with the same frame-type structure as in FIG. 3. In contrast to that example, however, in FIG. 4, a layer WS of an in particular metallic material, which layer is soft in comparison with the frame-type structure, for example a solder layer, is additionally applied on the metal frame MR. The layer WS has a relatively small layer thickness and has a larger width than the frame-structure VM on the MEMS chip. This embodiment has the advantage that when the MEMS chip MC is placed onto the metal frame MR and on account of a pressure exerted on the MEMS chip MC, the frame-type structure VM can press into the soft metal layer WS. Larger tolerances are thus permitted with regard to the planarity since possible height differences are compensated for by the frame-type structure being pressed more deeply or less deeply into the soft metal layer WS. The pressing-in is carried out, e.g., at a temperature of 150-200°. This has the advantage that during the later fixed connection and at the high temperatures necessary for this purpose, it is no longer possible for an impermissible excess pressure to build up in the enclosed cavity.

As a result of the frame-type structure being pressed into the soft layer, an intimate contact between the materials to be connected is also produced which facilitates the final connection between frame-type structure and metal frame or soft metal layer WS applied thereto. If the soft metal layer is embodied as a solder layer, a soldering with the frame-type structure is achieved. A differently chosen soft metal layer WS can be welded with the frame-type structure in a thermosonic method. The thickness of the solder layer can advantageously be chosen such that, at approximately 275° C., a non-fusible SnCu alloy with the frame material is at least partially formed, which no longer flows during later reflow soldering and the interior thus remains closed as a permanently tight cavity.

Figure 5:
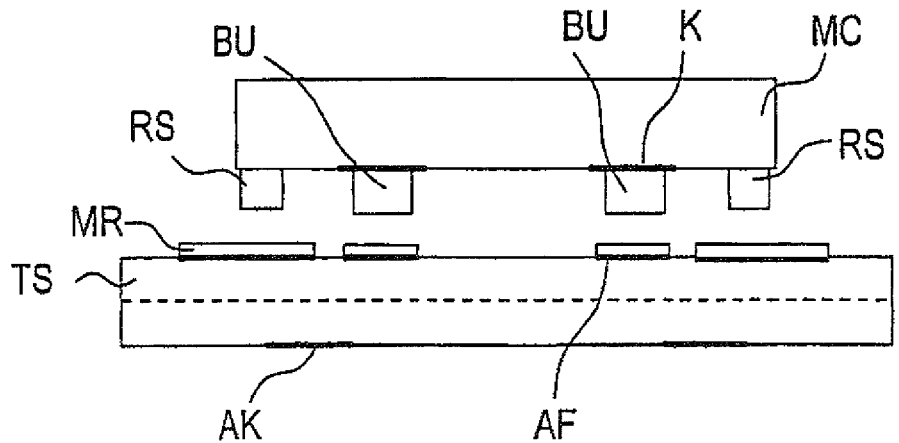
FIG. 5 shows an arrangement in cross section in accordance with a fourth exemplary embodiment.

FIG. 5 shows a further embodiment in schematic cross section, wherein the metal frame is reduced to the height of an under bump metallization (UBM). The UBM can be constructed in multilayered fashion and comprise, for example, an adhesion layer and a solderable or bondable layer or a layer having a bondable or solderable surface. Accordingly, the height of the metal frame MR in this embodiment is significantly smaller than that in the abovementioned embodiments.

In contrast thereto, a correspondingly high frame-type structure RS formed from metal, in particular, is produced in the edge region on the underside of the MEMS chip MC. The structure can include the materials as described above. Due to the larger height, while complying with a favorable aspect ratio, the structure also has a higher width than the embodiment described in FIGS. 3 and 4. This embodiment is advantageous particularly when a planar or subsequently planarized carrier substrate is used, e.g., when a subsequently planarized LTCC is used as carrier substrate. In this case, it is also expedient to concomitantly produce additional supporting structures, so-called pillars, on the underside of the MEMS chips, which already intrinsically has a planar surface. Pillars and frame-type structure RS can then bear in a flush fashion and with a minimal gap upon placement on the metal frame MR formed as a UBM, owing to the planar surfaces on both sides.

In one modification of this method, a thin tin layer is applied at least on the surface of the metal frame MR or the surface of the frame-type structure RS, which tin layer enables a soldering. Metal frame MR and connection pads AF can be produced from the same material or the same material combination. However, it is also possible to produce exclusively a UBM for the connection pads AF, and in contrast a UBM and a tin layer arranged thereon for the metal frame MR. The UBM can then have an Sn or SnAgCu surface. In this exemplary embodiment, the connection formation can be effected by means of a thermosonic method, a reflow process or by a combination of both methods. Furthermore, it is possible to apply the pillars on the carrier substrate and to provide a solder layer on the metal frame. Solder layers can then likewise be applied on contact areas corresponding to the pillars on the MEMS chip MC. Solder layers on the metal frame and contact areas then can be configured differently, such that during optimization it is possible to adapt the corresponding coefficients of thermal expansion normal to the surface of the carrier substrate. It is possible also to use a different solder for the connection formation at the metal frame than for the production of the electrical connection via the pillars, which can differ with regard to hardness, melting point or strength.

In the case of a metal frame embodied as a tin-plated UBM, with the Cu-comprising frame-type structure RS and, if appropriate, the pillars, an SnCu solder then arises through the Cu interface of the pillar and/or the UBM during the reflow process.

FIG. 6 shows an arrangement before connection, this arrangement being similar in principle to the arrangement already described in FIG. 3. Alongside the bumps BU for electrical connection, this arrangement comprises a metal frame MR on the carrier substrate TS and also a metallic frame-type structure RS in the edge region at the underside of the MEMS chip MC. The metal frame MR having the height $h_2$ and the frame-type structure RS having the height $h_1$ can comprise identical or different materials and have approximately the same height. The materials are chosen such that they can be connected in a thermosonic method. A preferred material for this purpose is once again copper, which can be planarized well and, by being provided with a bondable surface composed of gold, for example, can also be connected to a similar surface in a thermosonic method.

In one variant of this method, a further metal layer or a partial layer, into which tiny particles of hard materials such as diamond grains, for example, are incorporated, is produced on the metal surface either of the metal frame or of the metallic frame-type structure. The layer is applied on the metal frame in particular after planarization. It is then ensured that these hard finely divided particles project partly from the surface of the layer or partial layer into which they are incorporated. When carrier substrate and MEMS chip are connected, or when the frame-type structure is placed onto the metal frame, these protruding hard particles can then press into the metallic surface respectively lying opposite. What is achieved in this way is that an oxide layer possibly formed is broken up or pierced, the underlying metal being uncovered and being available for a bonding process. Furthermore, this method, also referred to as "nano-piercing", ensures a stronger connection as a result of the mutual interlacing by means of the hard particles drilling in.

If metal frame MR and frame-type structure RS consist of different materials then it is advantageous for their heights above the carrier substrate and respectively above the MEMS chip to be put into a suitable relationship in order to achieve a desired coefficient of the thermal expansion. It is optimal if the assemblage composed of metal frame and frame-type structure has in total the same thermal expansion behavior as the bump BU. This is achieved if the corresponding heights and coefficients of expansion CTE are put into the following relationship:

$$h_2 \times CTE(MR) + h_1 \times CTE(RS) = (h_1 + h_2) \times CTE(BU)$$

This dimensioning rule with regard to the coefficients of expansion and the heights to be correspondingly complied with for producing a stress-free assemblage is also of interest particularly in the case of embodiments according to FIG. 1 if the connecting region has a coefficient of expansion which deviates greatly from the bump material. This is the case for polymers, in particular, which have a coefficient of expansion that is increased approximately ten-fold with respect to metal. This can only be compensated for with a correspondingly small ratio $h_1:h_2$.

FIG. 7 shows, in cross section, an arrangement after the connection of MEMS chip MC and carrier substrate TS. The bumps BU now connect the electrical contacts K to the connection pads AF, while a cavity HR has been produced and enclosed between MEMS chip and carrier substrate in a manner sealed by metal frame and frame-type structure RS. This is independent of the materials chosen for metal frame, frame-type structure or, if appropriate, connecting region.

Particularly in the case where different materials are used for MEMS chip MC and carrier substrate TS, it may be necessary to increase the mechanical strength of the connection in the plane (xy direction) in order to prevent shearing of the MEMS chip MC in the plane. For this purpose, two possibilities in principle are appropriate, which can additionally be combined with one another.

In this respect, FIG. 8 shows, in schematic cross section, a first possibility, wherein a whole-area metallization is provided on the rear side of MEMS chip, metal frame and carrier substrate. This metallization, which can be applied with a thickness of 20 to 50 μm, for example, can be produced in a two-stage method. For this purpose, firstly a thin metal layer is applied over the whole area via the gas phase, for example, in a sputtering method. Titanium- and/or nickel-containing layers are well suited for this purpose. The reinforcement to give the desired thickness can then be effected in an electrolytic method. It proves to be advantageous here for the cavity enclosed under the MEMS chip and the component structures of the MEMS chip arranged therein to be closed off sufficiently tightly, such that ingress of undesirable materials, and in particular of liquids, need not be feared either during the sputtering method or in the subsequent electrolytic process and damage to the sensitive component structures is thus precluded.

With the whole-area metallization illustrated in FIG. 8, the MEMS chip MC is stabilized in the xy direction and fixed to the carrier substrate TS. In this way the strength of the connection is increased and it is practically impossible for the connection to be detached or damaged. The metal layer GM can substantially comprise copper, for example, which is simple to apply in an electrolytic method. It is possible but not necessary to additionally apply a nickel or gold layer as a passivation layer.

In a further embodiment, before the whole-area metallization is applied, a plastic film is applied over the entire rear side in such a way that it covers MEMS chip MC, metal frame MR and surface of the carrier substrate TS. Afterward, part of the plastic film is removed at least in the region of the metal frame and the metal frame is uncovered there. The uncovering is preferably effected along a line enclosing the MEMS chip. If a light-sensitive film is used for the plastic film it can be structured directly by means of light or a laser. Photopatterning with the aid of an additionally applied photoresist or uncovering solely by means of the thermal action of the laser is also possible, however. Afterward, as described above, the whole-area metallization can be applied, which can then terminate with the metal frame in the uncovered region and thus enables a hermetic sealing.

The plastic film can be structured directly or indirectly in such a way that acoustically damping structures also arise simultaneously on the rear side of the MEMS chip. An, e.g., regular or irregular pattern structured into the plastic film on the rear side of the MEMS chip produces, during the subsequent metallization, a corresponding metallization pattern into which disturbing bulk acoustic waves couple and then peter out there or are damped there. In the combination with a plastic film which is reflow-stable up to approximately 260° C. and has a thickness of 2 μm to 20 μm, a metallization thickness of approximately 10-30 μm is appropriate for this purpose. Cu or Ni or a layer combination comprising Ni and Cu can be applied as metal.

FIG. 9 illustrates, in cross section, a further component, which here is also covered with a plastic covering GT in addition to the whole-area metallization. The plastic covering can be applied by an injection method, for example by means of injection molding or by dropwise application of reaction resin as glob top composition. This plastic enclosure GT can be produced in addition or as an alternative to the metallization GM. The plastic enclosure can be applied with a significantly higher thickness than the metal layer, for example with a thickness of 50 μm to 500 μm.

After the connection of MEMS chip MC and carrier substrate TS, metallization of the rear side and/or covering with a plastic enclosure, the production processes for the MEMS components have ended. The individual components, if a plurality are produced on a large-area carrier substrate, can subsequently be singulated. This can be effected, for example by means of sawing along the separating lines TL illustrated in FIG. 2.

However, it is also possible for the singulation also to be performed on the chip side, if a plurality of MEMS chips arranged on a MEMS wafer are used at the wafer level and a multiplicity of MEMS chips realized on a wafer are therefore placed jointly onto a multiplicity of metal frames and are connected thereto. The singulation of the MEMS chips can be performed in a DBG method (dicing before grinding), wherein in the MEMS wafer firstly (before placement onto the carrier substrate) from the top side (corresponding to the underside in the mounted state) incisions are made along the separating lines down to a depth which corresponds to the later desired layer thickness of the chip. The MEMS wafer is subsequently ground from the rear side until the incisions made from the other side have been ground free and the components have thus been singulated. Such chip singulation is then performed before the application of the metal layer and/or the plastic covering.

The invention is not restricted to the variants described in the figures and the exemplary embodiments. Rather, it is possible to combine individual measures of the connection methods with one another. However, what is always important and advantageous in this case is that, in one common step or two similar steps that succeed one another in quick succession, both the electrical connection and the sealing of the cavity between MEMS chip and carrier substrate are effected, which is at least sufficient to ensure that the component can be encapsulated further by means of subsequent processes by further coverings with metal and/or plastic.

What is claimed is:

1. A method for producing a MEMS component, the method comprising:
   providing a carrier substrate having a mounting location, the mounting location having a number of electrical connection pads on a top side and external contacts connected thereto on an underside, wherein a metal frame having a planar surface encloses the connection pads of the mounting location, the metal frame being produced substantially from copper;
   providing a MEMS chip having electrical contacts on an underside, the MEMS chip bearing MEMS structures;
   planarizing a surface of the metal frame by milling;
   forming a connecting region on the metal frame and/or on an edge region at the underside of the MEMS chip;
   after forming the connecting region, placing the MEMS chip on the mounting location of the carrier substrate in such a way that the MEMS chip is seated with an edge region of its underside on the metal frame;
   after planarizing the surface, connecting the MEMS chip to the carrier substrate in one step by connecting the electrical contacts of the MEMS chip to the connection pads of the carrier substrate by means of bumps and also connecting the MEMS chip to the metal frame such that a closed cavity is formed between the MEMS chip and the carrier substrate; and
   pressing the MEMS chip and the carrier substrate against one another with pressure before or during connecting the MEMS chip and the carrier substrate;
   wherein the MEMS chip is connected to the carrier substrate using a bonding method selected from the group consisting of thermosonic bonding, soldering, and a bonding method that comprises applying heat to the metal frame, which includes a connecting region of tin.

2. The method as claimed in claim 1, wherein the connecting region comprises a solder layer.

3. The method as claimed in claim 1, wherein:
   providing the MEMS chip comprises providing a MEMS chip with a frame-type structure applied in the edge region on the underside of the MEMS chip;
   placing the MEMS chip comprises placing the frame-type structure of the MEMS chip onto the metal frame of the carrier substrate; and
   connecting the metal frame to the MEMS chip comprises connecting the frame-type structure and the metal frame to one another directly or with the aid of the connecting region.

4. The method as claimed in claim 1, further comprising forming solder or stud bumps on the electrical contacts of the MEMS chip before placing of the MEMS chip on the mounting location.

5. The method as claimed in claim 1, further comprising:
   forming a first solder layer on the metal frame and a further solder layer on the electrical contacts, wherein the first solder layer and the further solder layer differ in solder material and/or thickness; and
   forming pillars above the connection pads on the carrier substrate, the metal frame being formed at the same time as the pillars, the first solder layer, the further solder layer and the pillars being used when connecting the MEMS chip and the carrier substrate.

6. The method as claimed in claim 1, wherein connecting the MEMS chip to the carrier substrate uses a thermosonic method.

7. The method as claimed in claim 1, further comprising forming a metallization over uncovered surfaces of the carrier substrate, the metal frame and the MEMS chip after the connecting the MEMS chip and the carrier substrate.

8. The method as claimed in claim 7, wherein forming the metallization comprises first applying a base metallization by sputtering and then reinforcing the base metallization electrolytically or electrolessly.

9. The method as claimed in claim 1, further comprising potting or encapsulating the MEMS chip and carrier substrate after connecting the MEMS chip and the carrier substrate, the potting or encapsulating performed by injection molding with a plastic composition.

10. The method as claimed in claim 1, further comprising passivating the surface of the metal frame after milling.

11. The method as claimed in claim 1, further comprising:
    forming a frame-type structure on the underside of the MEMS chip;
    applying nanoparticles to the surface of the metal frame and/or of the frame-type structure, the nanoparticles composed of a material having a greater hardness than the metal frame and the frame-type structure; and
    pressing the nanoparticles into the frame-type structure and/or the metal frame under pressure while placing the MEMS chip.

12. The method as claimed in claim 1, wherein the MEMS chip is connected to the carrier substrate by soldering.

13. The method as claimed in claim 12, wherein the MEMS chip is connected to the carrier substrate using a thin connection region of solder layer deposited on top of the metal frame before placing the chip onto the carrier.

14. The method as claimed in claim 1, wherein the MEMS chip is connected to the carrier substrate using a bonding method that comprises applying heat to the metal frame, which includes a connection region of tin.

15. A method for producing a plurality of packaged MEMS components, the method comprising:
    providing a large-area carrier substrate having a plurality of mounting locations, each mounting location having a number of electrical connection pads on a top side and external contacts connected thereto on an underside, wherein a metal frame having a planar surface encloses the connection pads of each mounting location;
    providing a plurality of MEMS chips, each MEMS chip having electrical contacts on an underside and bearing MEMS structures;
    placing each MEMS chip on a respective one of the mounting locations of the carrier substrate in such a way that each MEMS chip is seated with an edge region of its underside on the metal frame of the respective one of the mounting locations; and
    in one step, connecting the electrical contacts of each MEMS chip to the connection pads of the associated mounting location by means of bumps and also connecting each MEMS chip to the metal frame of the associated mounting location such that a closed cavity is formed between each MEMS chip and the carrier substrate;
    wherein the method further comprises forming a connecting region before placing each MEMS chip, the connecting region being applied on the metal frame and/or on the edge region at the underside of the MEMS chip;
    wherein the method further comprises pressing the MEMS chips and the carrier substrate against one another with pressure before or during connecting the MEMS chips and the carrier substrate;
    wherein the metal frame is produced substantially from copper, the method further comprising planarizing a surface of the metal frame by milling before connecting the MEMS chips and the carrier substrate; and
    wherein each MEMS chip is connected to the carrier substrate using a bonding method selected from the group consisting of thermosonic bonding, soldering, and a bonding method that comprises applying heat to the metal frame, which includes a connection region of tin.

16. The method as claimed in claim 15, further comprising singulating the carrier substrate along separating lines running between the mounting locations so as to form a plurality of separated MEMS components.

17. The method as claimed in claim 16, further comprising forming a metallization over uncovered surfaces of the carrier substrate, the metal frame and the MEMS chip before singulating the carrier substrate.

18. The method as claimed in claim 16, further comprising potting or encapsulating the MEMS chip and carrier substrate before singulating the carrier substrate.

* * * * *